US005785552A

United States Patent [19]

Uchida

[11] Patent Number: 5,785,552
[45] Date of Patent: Jul. 28, 1998

[54] PANEL FIXING CONNECTOR

[75] Inventor: Katsura Uchida, Shizuoka, Japan

[73] Assignee: Yazaki Corporation, Tokyo, Japan

[21] Appl. No.: 740,954

[22] Filed: Nov. 5, 1996

[30] Foreign Application Priority Data

Nov. 13, 1995 [JP] Japan .................................. 7-294073

[51] Int. Cl.[6] .................................. H03R 13/74
[52] U.S. Cl. .................................. 439/557
[58] Field of Search .................................. 439/557, 555, 439/558, 552, 554

[56] References Cited

U.S. PATENT DOCUMENTS 5,613,876 3/1997 Sakatani et al. .................................. 439/552

FOREIGN PATENT DOCUMENTS 5-87844 11/1993 Japan .
5-335056 12/1993 Japan .

*Primary Examiner*—Gary F. Paumen
*Attorney, Agent, or Firm*—Sughrue, Mion, Zinn, Macpeak & Seas, PLLC

[57] ABSTRACT

In a stand-by condition, a distal end of a lock portion is received in a lock protective portion and it is not projected beyond a hood portion of a housing, and therefore the lock portion will not be broken during transport. When fixing the connector to a panel, pawls of the housing portion are inserted into a through hole in the panel, and are positioned relative thereto, and then the lock portion is slid, and therefore the lock portion will not accidentally strike against the panel, and hence will not be damaged.

4 Claims, 4 Drawing Sheets

PANEL FIXING CONNECTOR

BACKGROUND OF THE INVENTION

This invention relates to a panel fixing connector.

FIG. 10 shows a conventional panel fixing connector mounted in a through hole formed through a panel (Japanese Utility Model Unexamined Publication No. Hei 5-87844).

The panel fixing connector 1 shown in FIG. 10 includes a terminal receiving portion 1*a*, and a housing portion 1*b* which has a fitting hole 1*e* for receiving a mating member, and also has lock portions 1*c* each having a tapering projection at its distal end.

The panel fixing connector 1 is inserted into a panel hole 2*a*, formed through a panel 2 of a car body or the like, in a direction X in FIG. 10, and the lock portions 1*c* at a distal end of the connector are flexed, and are projected to a Y-side, so that the lock portions 1*c* are retainingly engaged with the Y-side surface of the panel 2, thereby fixing the connector.

Although the above conventional connector can be fixed to the panel quite easily, it has the following problems. In the above conventional connector, the lock portions 1*c* are exposed, and are lower in strength than the other portions since these lock portions 1*c* need to be flexed when inserting the connector into the panel hole. Therefore, when an accidental external force acted on the lock portion 1*c* during transport of the connector, the lock portion 1*c* was often broken or damaged. And besides, when fixing the connector to the panel, the lock portions 1*c* were caused to inadvertently strike against the panel, and therefore were often broken or damaged.

SUMMARY OF THE INVENTION

It is therefore an object of this invention to provide a panel fixing connector which prevents damage to a lock portion during transport, and achieves a good efficiency of the fixing operation. Another object of the invention is to provide a panel fixing connector which prevents the lock portion from being inadvertently damaged when fixing the connector to the panel.

To achieve the above object, according to a first aspect of the present invention, there is provided a panel fixing connector including a housing portion having retaining means for retaining engagement with a panel, and a terminal receiving portion; characterized in that the retaining means is movable between a retaining position where the retaining means is retainingly engaged with the panel and a stand-by position; and the connector includes a protective member for protecting the retaining means in the stand-by position. In this panel fixing connector, the retaining means can be so constructed as to slide relative to the protective member. In the stand-by position, a distal end of the retaining means can be received within the protective member.

According to a second aspect of the invention, there is provided a panel fixing connector including a housing portion having retaining means for retaining engagement with a panel, and a terminal receiving portion; characterized in that the connector includes a protective member for protecting the retaining means; the protective member is movable between a retaining position where the retaining means is retainingly engaged with the panel and a stand-by position; and the protective member protects the retaining means in the stand-by position of the protective member. In this connector of the second aspect, the protective member slides relative to the retaining means contrary to the first aspect of the invention. The retaining means can also be constructed so as to slide relative to the protective member as the first aspect of the invention. In the stand-by position, a distal end of the retaining means can be received within the protective member.

DETAILED DESCRIPTION OF THE INVENTION

Preferred embodiments of the present invention will now be described with reference to the accompanying drawings.

First Embodiment

Figure 1:
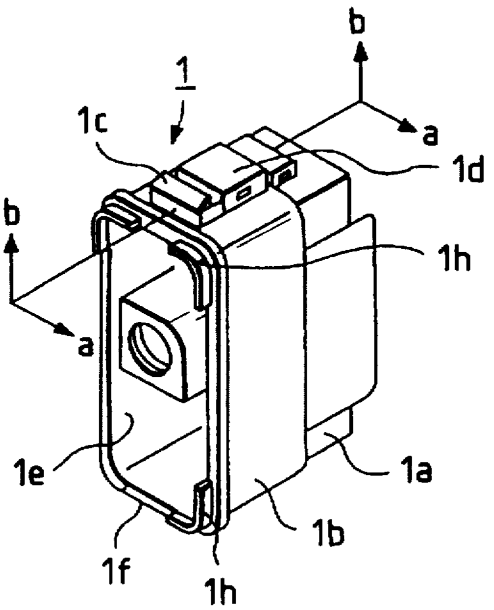
FIG. 1 is a perspective view of a first embodiment of a panel fixing connector of the present invention before it is attached to a panel.
Figure 2:
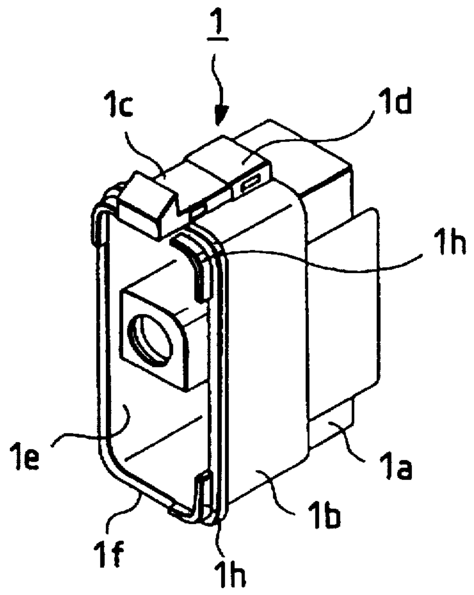
FIG. 2 is a perspective view of the panel fixing connector of the first embodiment attached to the panel (not shown)
Figure 3A:
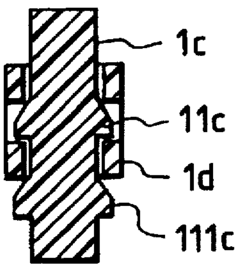
FIGS. 3(*a*) and 3(*b* ) are cross-sectional views, showing the conditions of a lock portion and a lock protective portion of the panel fixing connector according to the first embodiment of the invention.
Figure 3B:
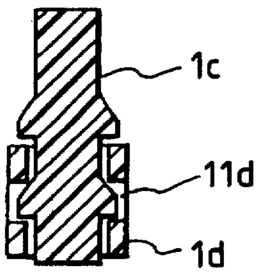
Figures 4A, 4B, 4C:
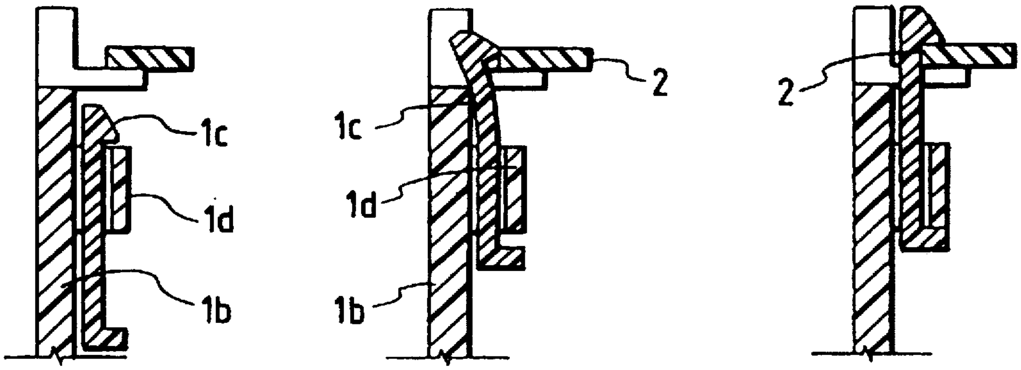
FIGS. 4(*a*) to 4(*c*) are cross-sectional views, showing the conditions of the lock portion and the lock protective portion of the panel fixing connector according to the first embodiment of the invention.
Figure 10:
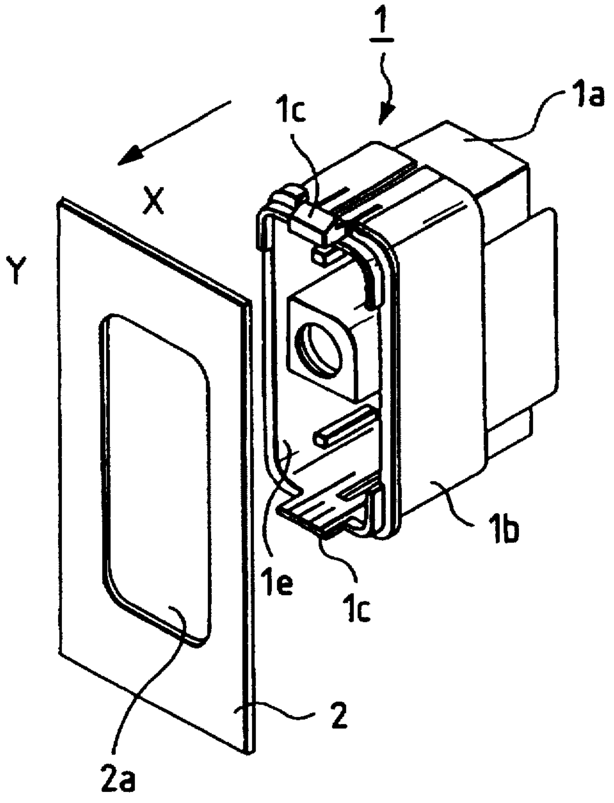
FIG. 10 PRIOR ART
FIG. 10 is a perspective view of a conventional panel fixing connector.

FIGS. 1 to 4 show a first embodiment of the present invention, and FIG. 1 is a perspective view of a connector of this embodiment before it is attached to a panel, with retaining means held in a stand-by position, FIG. 2 is a perspective view of the connector attached to the panel (not shown), with the retaining means held in a mounting position, FIGS. 3(*a*) and 3(*b*) are cross-sectional views taken along the plane a—a of FIG. 1, showing the conditions of a lock portion and a lock protective portion before and after the connector is attached to the panel, and FIGS. 4(*a*) to 4(*c*) are cross-sectional views taken along the plane b—b of FIG. 1, showing the conditions of the lock portion and the lock protective portion before and after the connector is attached to the panel. The same reference numerals as used in FIG. 10 showing the conventional panel fixing connector denote like portions, respectively.

The connector 1 of this embodiment includes a terminal receiving portion 1*a*, and a housing portion 1*b* which has a fitting hole 1*e* for receiving a mating member, a lock portion (retaining means) 1*c* having a tapering projection at its distal end, and a lock protective portion 1*d* for protecting the lock portion 1*c*.

The lock protective portion 1d is of a hollow construction, and the lock portion 1c is slidably received in this hollow portion. As shown in FIGS. 3 and 4, a pair of projections 11c and 111c are formed on each of opposite side surfaces of the lock portion 1c, and each of opposite side walls of the lock protective portion 1d has a side hole 11d for receiving the projections 11c and 111c. As described above, FIG. 1 shows the connector before it is attached to the panel, and in this condition the distal end of the lock portion 1c is not projected beyond a hood portion 1f of the housing portion 1b adapted to contact the panel. In the present invention, this condition is referred to as the stand-by position of the lock portion 1c.

For fixing the connector to the panel, pawls 1h of the hood portion 1f are inserted into a through hole in the panel, and are positioned with respect to this through hole, and then the lock portion 1c is slid toward the panel so as to retain the tapering projection, formed at the distal end of the lock portion 1c, on a peripheral edge portion of the through hole 2a in the panel, thereby fixing the connector.

FIGS. 3(*a*) and 4(*a*) are cross-sectional views showing the condition of the lock protective portion before the connector is attached to the panel. Before the connector is attached to the panel, the projections 11c are fitted respectively in the side holes 11d in the lock protective portion 1d to thereby prevent the lock portion 1c from sliding during transport. Therefore, the sliding movement of the lock portion 1c is prevented during transport.

FIG. 4(*b*) shows the condition during the fixing of the connector to the panel. The operator slides the lock portion 1c toward the panel, and the tapering projection at its distal end of this lock portion 1c passes past the panel 2, and is finally retained on the peripheral edge portion of the through hole in the panel 2 as shown in FIG. 4(*c*), thereby fixing the connector. The relation between the projections of the lock portion 1c and the lock protective portion 1d at this time is shown in FIG. 3(*b*), and the projections 111c are engaged respectively in the engagement holes 11d in the lock protective portion 1d, thereby maintaining the fixed condition.

As described above, in this embodiment, in the stand-by condition, the distal end of the lock portion 1c is not projected beyond the hood portion 1f of the housing portion 1b, and therefore the lock portion 1c will not be broken or damaged during transport. When fixing the connector to the panel, the pawls 1h on the housing portion 1b are first inserted into the through hole in the panel, and are positioned relative thereto, and then the lock portion 1c is slid, and therefore the lock portion 1c will not inadvertently strike against the panel by an operational mistake, and hence will not be damaged in contrast with the conventional construction.

Figure 5:
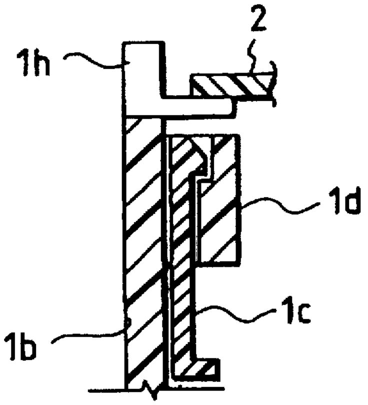
FIG. 5 is a view showing a modified lock protective portion.

FIG. 5 shows a modified lock protective member. This modification differs from the above embodiment in that in the stand-by condition of the lock portion 1c, the distal end of the lock portion 1c is received in the lock protective portion. With this construction, damage to the lock portion 1c during transport is more positively prevented.

Second Embodiment

Figure 6:
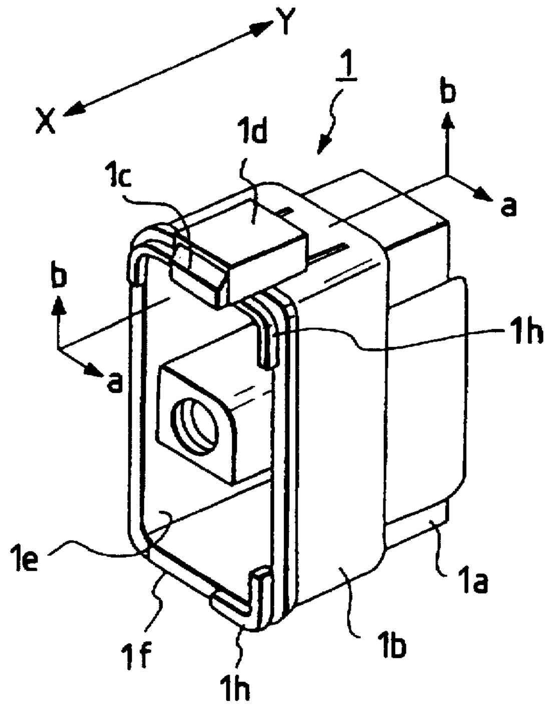
FIG. 6 is a perspective view of a second embodiment of a panel fixing connector of the present invention before it is attached to a panel.
Figure 7:
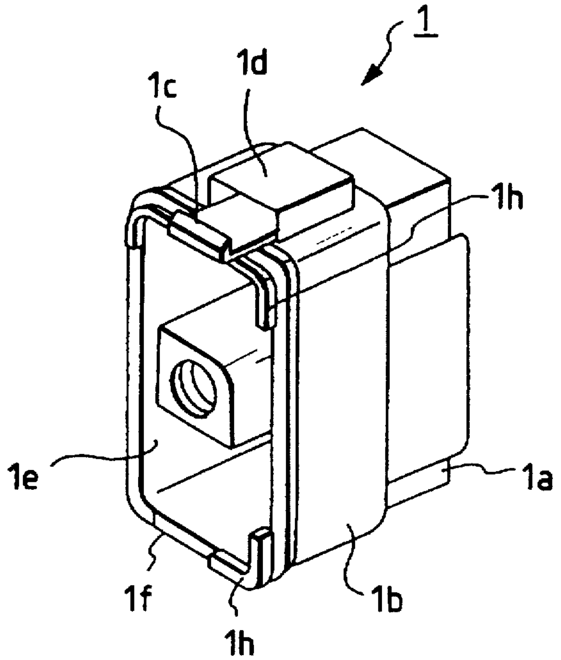
FIG. 7 is a perspective view of the panel fixing connector of the second embodiment attached to the panel.

FIGS. 6 to 9 show a second embodiment of the present invention. FIG. 6 is a perspective view of a connector of this embodiment before it is attached to a panel, with retaining means held in a stand-by position, FIG. 7 is a perspective view of the connector attached to the panel (not shown), with the retaining means held in a mounting position, FIGS. 8(*a*) and 8(*b*) are cross-sectional views taken along the plane a—a of FIG. 6, showing the conditions of a lock portion and a lock protective portion before and after the connector is attached to the panel, and FIGS. 9(*a*) to 9(*c*) are cross-sectional views taken along the plane b—b of FIG. 6, showing the conditions of the lock portion and the lock protective portion before and after the connector is attached to the panel. The same reference numerals as used for the first embodiment denote like portions, respectively. This embodiment differs from the first embodiment in that the lock protective portion is movable in this embodiment while the lock portion is movable in the first embodiment.

The connector 1 of this embodiment includes a terminal receiving portion 1a, and a -housing portion 1b which has a fitting hole 1e for receiving a mating member, a lock portion (retaining means) 1c having a tapering projection at its distal end, and a lock protective portion 1d for protecting the lock portion 1c.

Figure 8A:
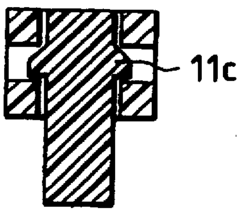
FIGS. 8(*a*) and 8(*b*) are cross-sectional views, showing the conditions of a lock portion and a lock protective portion of the panel fixing connector according to the second embodiment of the invention.
Figure 8B:
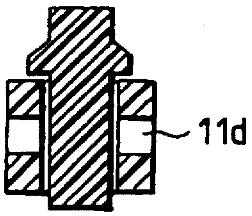
Figure 9A:
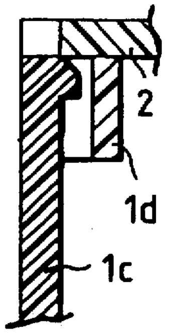
FIGS. 9(*a*) to 9(*c*) are cross-sectional views, showing the conditions of the lock portion and the lock protective portion of the panel fixing connector according to the second embodiment of the invention.
Figure 9B:
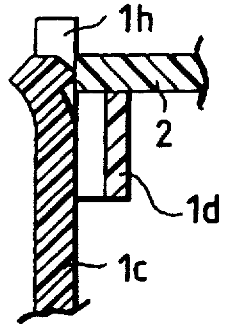
Figure 9C:
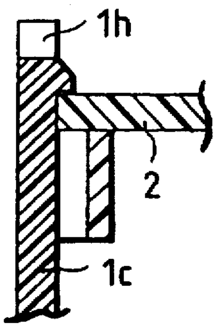

The lock protective portion 1d is of a hollow construction, and is slidable relative to the housing portion 1b in directions X and Y in the drawings. The lock portion 1c is fixed within this hollow portion. As shown in FIGS. 8 and 9, a projection 11c is formed on each of opposite side surfaces of the lock portion 1c, and each of opposite side walls of the lock protective portion 1d has a side hole 11d for receiving the projection 11c. FIG. 6 shows the connector before it is attached to the panel, and in this condition the lock protective portion 1d is located such that it receives the distal end of the lock portion 1c therein. In this embodiment, this condition is referred to as the stand-by position.

For fixing the connector to the panel, pawls 1h of a hood portion 1f are inserted into a through hole in the panel, and are positioned with respect to this through hole, and then the connector is pushed in the direction X. Since the distal end of the lock protective portion 1d is held against the panel, the lock protective portion 1d slides relative to the lock portion 1c in the direction Y, so that the distal end of the lock portion 1c is exposed from the lock protective portion 1d, and finally the tapering projection at the distal end of the lock portion 1c is retained on a peripheral edge portion of the through hole 2a in the panel, thereby fixing the connector.

FIGS. 8(*a*) and 9(*a*) are cross-sectional views showing the condition of the lock protective portion before the connector is attached to the panel. Before the connector is attached to the panel, the projections 11c of the lock portion 1c are fitted respectively in the side holes 11d in the lock protective portion 1d. Therefore, the sliding movement of the lock protective portion 1d is prevented during transport. FIG. 9(*b*) shows the condition during the fixing of the connector to the panel. Although the whole of the connector is pushed and moved toward the panel, the lock protective portion 1d is prevented from moving in this direction since it is held against the panel, and therefore the lock protective portion 1d slides in the direction Y relative to the lock portion 1c. As a result, the distal end of the lock portion 1c projects beyond the lock protective portion 1d as shown in FIG. 9(*b*), and further passes past the panel 1, and finally is retained on and fixed to the peripheral edge of the through hole in the panel, as shown in FIGS. 8(*b*) and 9(*c*).

As described above, in this embodiment, in the stand-by condition, the distal end of the lock portion 1c is received within the lock protective portion 1d, and hence is protected by it, and therefore the lock portion 1c will not be broken or damaged during transport. When fixing the connector to the panel, the pawls 1h on the housing portion 1b are first inserted into the through hole in the panel, and are positioned relative thereto, and then the connector body is pushed toward the panel, and therefore the lock portion 1c will not inadvertently strike against the panel by an operation mistake, and hence will not be damaged in contrast with the conventional construction. Simultaneously when the connector is pushed toward the panel, the lock protective portion 1*d* is automatically slid, and therefore a separate sliding operation as in the first embodiment does not need to be effected.

As described above, in the present invention, there is provided the panel fixing connector in which the lock portion will not be broken during transport and during the attaching operation, and besides the efficiency of the attaching operation is good.

What is claimed is:

1. A panel fixing connector including a housing portion and a terminal receiving portion, said connector comprising:

retaining means disposed on said housing portion for retaining said connector to a panel, said retaining means being slidable with respect to said housing portion between a retaining position wherein said connector is attached to the panel, and a stand-by position wherein said connector is free from attachment to the panel; and a protective member disposed on said housing portion for at least partially covering said retaining means so as to protect said retaining means at said stand-by position.

2. A panel fixing connector according to claim 1, wherein said retaining means is slidlable relative to said protective member.

3. A panel fixing connector according to claim 1, further comprising positioning means disposed on said housing portion and for positioning said connector relative to the panel when said connector is attached to the panel.

4. A panel fixing connector including a housing portion and a terminal receiving portion, said connector further comprising:

retaining means disposed on said housing portion and for retaining said connector to a panel, said retaining means being movable between a retaining position where said connector is attached to the panel and a stand-by position where said connector is free from attachment to the panel; and a protective member disposed on said housing portion and for protecting said retaining means at said stand-by position;

wherein said retaining means is slidable relative to said protective member; and wherein at said stand-by position, a distal end of said retaining means is received within said protective member.

* * * * *